United States Patent

Wu et al.

Patent Number: 5,885,894
Date of Patent: Mar. 23, 1999

[54] METHOD OF PLANARIZING AN INTER-LAYER DIELECTRIC LAYER

[75] Inventors: Jiunh-Yuan Wu, Hsinchu; Water Lur; Shih-Wei Sun, both of Taipei, all of Taiwan

[73] Assignee: United Microelectronics Corporation, Taiwan

[21] Appl. No.: 882,303

[22] Filed: Jun. 25, 1997

[51] Int. Cl.$^6$ .................................... C23C 16/40

[52] U.S. Cl. ..................... 438/624; 438/633; 438/692; 438/699; 438/761; 438/763; 438/778; 438/784; 438/787; 427/574; 427/579; 427/255; 427/255.3; 427/255.7

[58] Field of Search ................... 427/574, 579, 427/255, 255.3, 255.7; 438/692, 699, 763, 761, 778, 784, 787, 624, 633; 148/DIG. 43

[56] References Cited

U.S. PATENT DOCUMENTS 5,514,616  5/1996  Rostoker et al. ............... 437/57
5,554,554  9/1996  Bastani et al. ................. 437/47
5,686,356  11/1997  Jain et al. ...................... 437/195

OTHER PUBLICATIONS

Schuegraf, Handbook of Thin–Film Deposition Processes and Techniques, Noyes Publications, Park Ridge, New Jersey, pp. 128–129. (no month), 1988.

Primary Examiner—Shrive Beck
Assistant Examiner—Timothy Meeks
Attorney, Agent, or Firm—Rabin & Champagne, P.C.

[57] ABSTRACT

A method of planarizing an inter-layer dielectric layer includes using a high density plasma chemical vapor deposition method to deposit an undoped dielectric, which increases the polishing efficiency in a subsequent chemical-mechanical polishing operation, and eliminates the need for a high temperature densifying treatment for planarization. A chemical-mechanical polishing operation is used to planarize the inter-layer dielectric.

12 Claims, 3 Drawing Sheets

METHOD OF PLANARIZING AN INTER-LAYER DIELECTRIC LAYER

BACKGROUND OF THE INVENTION

1. Field of Invention

This invention relates in general to a planarization technique used in the manufacturing of integrated circuits. More particularly, this invention relates to a method of planarizing an inter-layer dielectric (ILD) layer.

2. Description of Related Art

In general, there are two types of dielectrics which are grouped under the title of inter-layer dielectric (ILD). The first type is a pre-metal dielectric (PMD), which refers generally to a dielectric material formed before a metallization process is performed. The PMD serves as an isolating layer located between a semiconductor component and a first metallic layer. The second type of dielectric is an inter-metal dielectric (lMD), which is a dielectric layer interposed between two metallic layers, and is used for isolation purposes.

FIG. 1a through 1c illustrate a conventional method of planarizing a PMD layer. First, and referring to FIG. 1a, a semiconductor substrate 10 having a field effect transistor (FET) 12 formed thereabove is provided. Thereafter, an undoped silicate glass (USG) layer 14 and a doped silicate glass layer 16 are formed, in sequence, above the semiconductor substrate 10. The undoped silicate glass layer 14 is formed, for example, using an atmospheric pressure chemical vapor deposition (APCVD) method, or a sub-atmospheric chemical vapor deposition (SACVD) method. The doped silicate glass layer 16 is composed from, for example, phosphosilicate glass (PSG) or borophosphosilicate glass (BPSG).

Referring next to FIG. 1b, a heat reflow operation is performed at a temperature of about 800° C. to about 900° C. As a result, the silicate glass layers 14 and 16 become denser, and obtain a smoother appearance.

Lastly, and referring to FIG. 1c, chemical-mechanical polishing (CMP) is used to planarize the doped silicate glass layer 16. Then, an oxide layer 18 is deposited thereabove using, for example, a plasma-enhanced chemical vapor deposition (PECVD) method (which forms a silicon dioxide layer). Alternatively, tetra-ethyl-ortho-silicate (TEOS) can be provided as the main reactive gas to form a silicon dioxide layer.

Before the performance of the operations shown in FIG. 1c, that is, immediately after CMP step, an oxide layer may first be deposited above the silicate glass layer 16. The oxide layer acts as a passivation layer for protecting the silicate glass layer 16 from the formation of void structure.

However, the conventional manufacturing process is complex and requires a high temperature to densify the silicate glass layers 14 and 16. Therefore, the known process is unsuitable for most logic circuit products, especially when the front end processes, in the manufacturing of integrated circuits, include self-aligned silicide processes. As such, planarization of the PMD layer cannot be achieved in this known manner. Additionally, when the silicate glass layer 16 is subjected to the CMP operation, the polishing rate and the uniformity of the layer is difficult to control.

SUMMARY OF THE INVENTION

It is therefore an object of this invention to provide an improved method of planarizing a PMD layer, in which the above-noted disadvantages are overcome. To accomplish this and other advantages, the present invention provides for a method, which includes providing a semiconductor substrate having gates and source/drain regions formed thereabove. An undoped silicate glass layer is deposited above the semiconductor substrate. The undoped silicate glass layer has a thickness greater than the thickness of the gate layer (which is about 1000 Å), and is deposited using high density plasma chemical vapor deposition. The undoped silicate glass layer is planarized using chemical-mechanical polishing. A doped silicate glass layer is then deposited.

Another object of this invention is to provide a method of planarizing an inter-layer dielectric layer, including forming a field effect transistor above a semiconductor substrate, and then depositing a metallic layer above the field effect transistor. An undoped silicate glass layer is deposited above the semiconductor substrate. The undoped silicate glass layer has a thickness greater than the thickness of the metallic layer (which has a thickness of about 1000 Å) and is deposited using high density plasma chemical vapor deposition. The undoped silicate glass layer is planarized using chemical-mechanical polishing. Then, a doped silicate glass layer is deposited to form a suitable isolation thickness between layers.

BRIEF DESCRIPTION OF THE DRAWINGS

Other objects, features, and advantages of the invention will become apparent from the following detailed description of the preferred but non-limiting embodiments. The description is made with reference to the accompanying drawings, in which.

DESCRIPTION OF THE PREFERRED EMBODIMENTS

FIRST PREFERRED EMBODIMENT

Figure 1A:
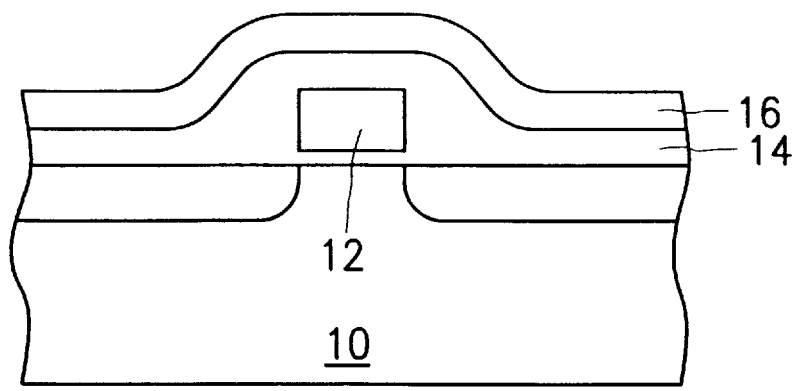
FIGS. 1a through 1c show a processing flow of a conventional method of forming a planarized pre-metal dielectric layer.
Figure 1B:
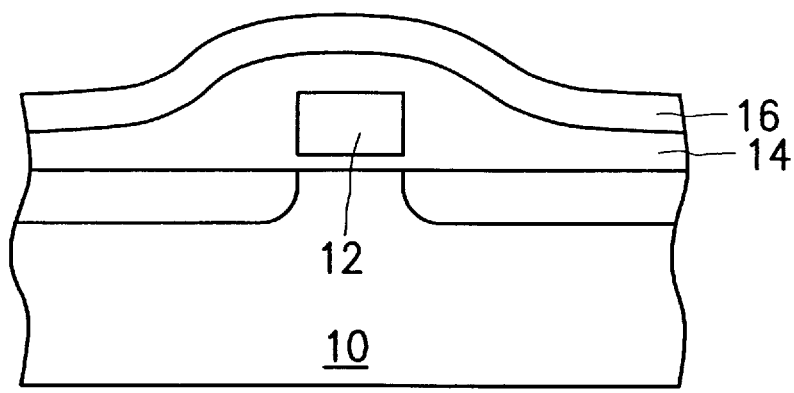
Figure 1C:
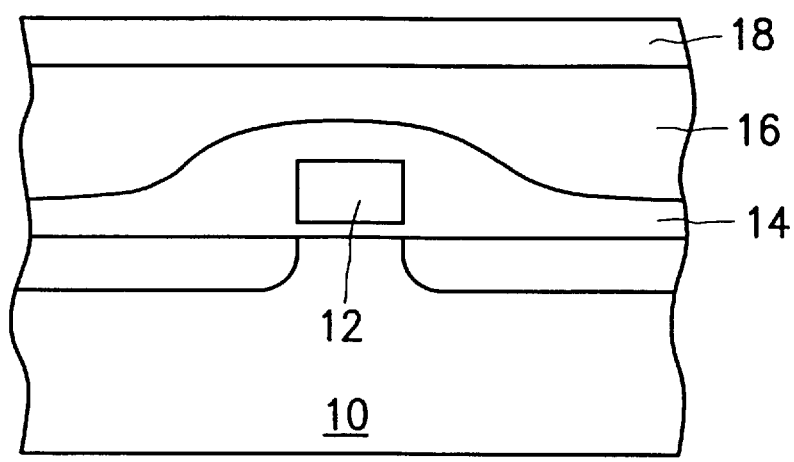
Figure 2A:
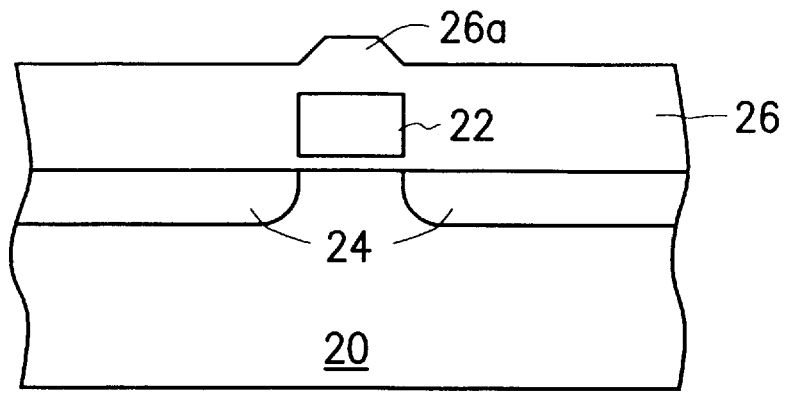
FIGS. 2a through 2c show a processing flow of a method of forming a planarized pre-metal dielectric layer, according to a first preferred embodiment of this invention.
Figure 2B:
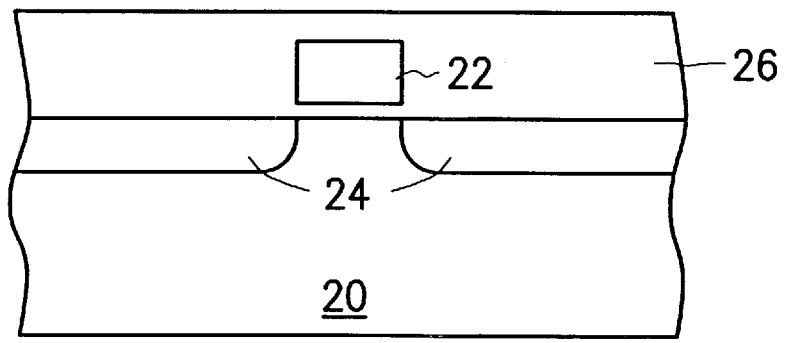
Figure 2C:
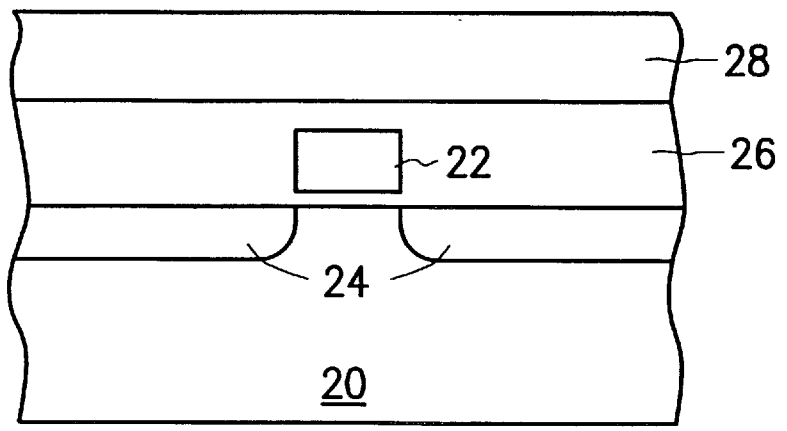

The process of planarizing a pre-metal dielectric layer is illustrated in FIGS. 2a through 2c. Referring to FIG. 2a, a semiconductor substrate 20, having a gate 22 and source/drain regions 24 formed thereabove, is provided. Thereafter, using a high density plasma-chemical vapor deposition (HDP-CVD) method, an undoped silicate glass layer 26 is deposited above the semiconductor substrate 20. The undoped silicate glass layer 26 has a thickness, for example, 1000 Å than the thickness of the gate layer 22 (which is about 1000 Å). Additionally, the undoped silicate glass layer 26 is deposited at an operating temperature of about 350° C. to about 450° C. Since the HDP-CVD method has a good gap filling ability, only minor protrusions 26a appear above the gate 22 after the deposition.

Referring next to FIG. 2b, the undoped silicate glass layer 26 is planarized using a CMP operation. Because only the minor protrusions 26a above the glass layer 26 will need to be removed, the CMP operation can be completed within about one minute.

Finally, and referring to FIG. 2c, a doped silicate glass layer 28, for example, a phosphosilicate glass (PSG) or a borophosphosilicate glass (BPSG), is deposited above the undoped silicate glass layer 26, after the planarization is performed. The deposition can be performed using, for example, plasma enhanced chemical vapor deposition. The high-temperature reflow or densification step is then unnecessary.

SECOND PREFERRED EMBODIMENT

Figure 3A:
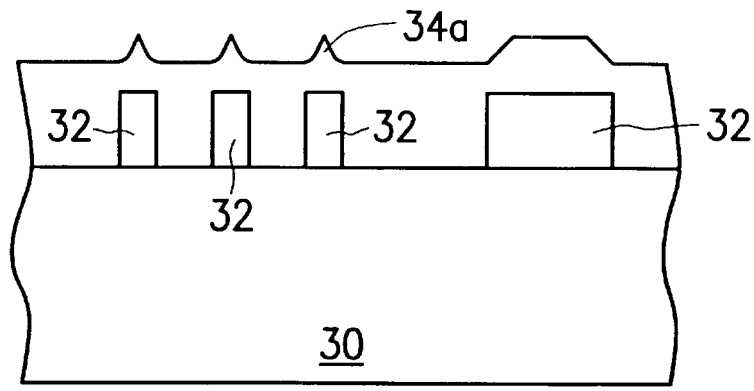
FIGS. 3a through 3c show a processing flow of a method of forming a planarized inter-metal dielectric layer, according to a second preferred embodiment of this invention.
Figure 3B:
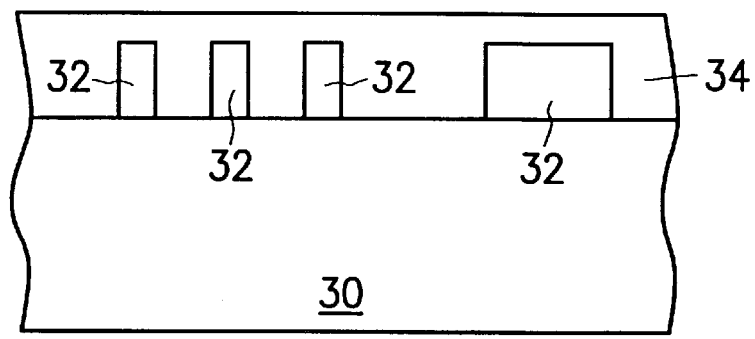
Figure 3C:
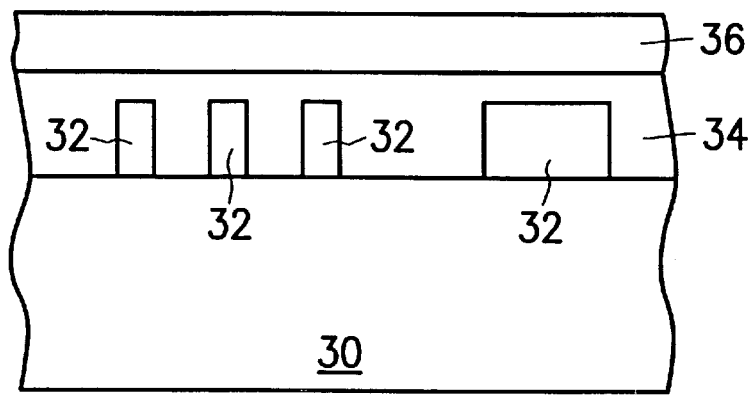

The process of planarizing an inter-metal dielectric layer is illustrated in FIGS. 3a through 3c. Referring to FIG. 3a, a semiconductor substrate 30 having a field effect transistor (FET) formed thereabove (not shown in the figure), and metallic layers 32 formed above the FET, is provided. Thereafter, using high density plasma-chemical vapor deposition (HDP-CVD), an undoped silicate glass layer 34 is deposited above the semiconductor substrate 20. The undoped silicate glass layer 34 has a thickness, for example, 1000 Å greater than a thickness of the metallic layers 32 (which is about 1000 Å), and is deposited at an operating temperature of about 350° C. to about 450° C. Since the HDP-CVD method has good gap filling abilities, only minor protrusions 34a will appear above the metallic layers 32 after the deposition.

Referring next to FIG. 3b, the undoped silicate glass layer 34 is planarized using CMP. Because only the minor protrusions 34a above the glass layer 34 will need to be removed, the CMP operation can be completed within about one minute.

Finally, and referring to FIG. 3c, a doped silicate glass layer 36, for example, a doped silicate glass formed by $SiH_4$ or TEOS chemicals with oxygen, is deposited above the undoped silicate glass layer 34 after the planarization procedure is performed. The doped silicate glass layer is deposited using, for example, plasma enhanced chemical vapor deposition.

The method according to this invention has at least the following advantages:

1. Due to the lower HDP-CVD operating temperature, the thermal requirements can be reduced. Therefore, the present invention is capable of meeting the stringent demands for very large scale integration (VLSI) production on dimensionally reduced components.

2. The polishing time required by the CMP operation is quite short. Nevertheless, the CMP operation still provides a good removal rate together with uniform polishing. Therefore, the present invention resolves the problem of controlling the polishing action in the conventional CMP operation, thus resulting in a higher throughput.

3. It is unnecessary to perform a further polishing operation on the doped silicate glass layer. Moreover, the doped silicate glass layer serves as a protective coverage in post CMP operations.

4. Processing is simple and cost effective.

5. This method can be applied to all ILD planarization processes, instead of just to PMD planarization processes.

While the invention has been described by way of example and in terms of the preferred embodiments, it is to be understood that the invention is not limited to the disclosed embodiments. To the contrary, it is intended to cover various modifications and similar arrangements as would be apparent to those skilled in the art. Therefore, the scope of the appended claims, which define the invention, should be accorded the broadest interpretation so as to encompass all such modifications and similar structures.

What is claimed is:

1. A method of planarizing an inter-layer dielectric layer, including:

providing a semiconductor substrate having a gate and a source/drain region formed thereabove;

depositing an undoped silicate glass layer directly on the semiconductor substrate and over the gate and source/drain region using high density plasma chemical vapor deposition, so that the undoped silicate glass layer has a thickness over the source/drain region that is greater than a thickness of the gate, thereby forming only minor protrusions over the gate;

planarizing the undoped silicate glass layer using chemical-mechanical polishing to remove the minor protrusions; and depositing a doped silicate glass layer directly on the undoped silicate glass layer.

2. The method according to claim 1, wherein said depositing an undoped silicate glass layer includes depositing the undoped silicate glass layer to a thickness which is about 1000 Å greater than the thickness of the gate.

3. The method according to claim 1, wherein said depositing an undoped silicate glass layer includes performing the high density plasma chemical vapor deposition at an operating temperature between about 350° C. to about 450° C.

4. The method according to claim 1, wherein said planarizing the undoped silicate glass layer includes polishing for one minute or less.

5. The method according to claim 1, wherein said depositing a doped silicate glass layer includes forming the doped silicate glass layer using plasma enhanced chemical vapor deposition.

6. The method according to claim 1, wherein said depositing a doped silicate glass layer includes forming the doped silicate glass of a phosphosilicate glass.

7. The method according to claim 1, wherein said depositing a doped silicate glass layer includes forming the doped silicate glass of borophosphosilicate glass.

8. A method of planarizing an inter-layer dielectric layer, including:

forming a field effect transistor above a semiconductor substrate;

depositing a metallic layer above the field effect transistor;

depositing an undoped silicate glass layer directly on the semiconductor substrate and over the metallic layer using high density plasma chemical vapor deposition, so that the undoped silicate glass layer has a thickness over the semiconductor substrate in regions adjacent to the metallic layer that is greater than a thickness of the metallic layer, thereby forming only minor protrusions over the metallic layer;

planarizing the undoped silicate glass layer using chemical-mechanical polishing to remove the minor protrusions; and depositing a doped silicate glass layer directly on the undoped silicate glass layer.

9. The method according to claim 8, wherein said depositing an undoped silicate glass layer includes depositing the undoped silicate glass layer to a thickness which is about 1000 Å greater than the thickness of the metallic layer.

10. The method according to claim 8, wherein said depositing an undoped silicate glass layer includes performing the density plasma chemical vapor deposition at an operating temperature between about 350° C. to about 450° C.

11. The method according to claim 8, wherein said planarizing the undoped silicate glass layer includes polishing for one minute or less.

12. The method according to claim 8, wherein said depositing a doped silicate glass layer includes forming the doped silicate glass layer using plasma enhanced chemical vapor deposition.

* * * * *